(12) United States Patent
Nishihashi et al.

(10) Patent No.: US 6,972,202 B2
(45) Date of Patent: Dec. 6, 2005

(54) METHOD OF MANUFACTURING AND TESTING A SEMICONDUCTOR DEVICE

(75) Inventors: Ryouji Nishihashi, Hyogo (JP); Kunio Kobayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 51 days.

(21) Appl. No.: 10/653,285

(22) Filed: Sep. 3, 2003

(65) Prior Publication Data

US 2004/0185585 A1 Sep. 23, 2004

(30) Foreign Application Priority Data

Mar. 20, 2003 (JP) .............................. 2003-076920

(51) Int. Cl.[7] .......................... H01L 21/00; H01L 21/78
(52) U.S. Cl. ........................................ 438/17; 438/464
(58) Field of Search ........................... 324/765; 438/17, 438/18, 460, 464

(56) References Cited

U.S. PATENT DOCUMENTS 3,766,638 A * 10/1973 Moore ......................... 438/464
5,389,182 A * 2/1995 Mignardi ..................... 156/344
6,713,366 B2 * 3/2004 Mong et al. ................. 438/459
6,768,332 B2 * 7/2004 Lin et al. ..................... 324/765

FOREIGN PATENT DOCUMENTS

JP          6-5668      1/1994
JP          7-74131     3/1995

OTHER PUBLICATIONS

IBM Technical Disclosure Bulletin NN71053652 entitled "Chip testing and Sorting," May 1971.*

* cited by examiner

Primary Examiner—Evan Pert
(74) Attorney, Agent, or Firm—McDermott Will & Emery LLP

(57) ABSTRACT

A method of testing a semiconductor device includes the steps of: positioning on a surface of a test jig a semiconductor wafer provided with the semiconductor device; dividing the semiconductor wafer into a plurality of semiconductor chips on the surface by dicing the semiconductor wafer; and, with the plurality of semiconductor chips positioned on the surface, testing an electrical characteristic of semiconductor device.

Consequently, a method of testing a semiconductor device which can test an electrical characteristic with higher accuracy prior to an assembling step, can be provided.

3 Claims, 6 Drawing Sheets

METHOD OF MANUFACTURING AND TESTING A SEMICONDUCTOR DEVICE

BACKGROUND OF THE INVENTION

1. Field of the Invention

This invention relates generally to a method of testing a semiconductor device, and, more particularly, to a method of testing a semiconductor device prior to an assembling step in a process of manufacturing a semiconductor device.

2. Description of the Background Art

Conventionally, an electrical characteristic of a semiconductor device is tested twice in a broader sense. Initially, in the form of a semiconductor wafer, a first test called wafer test is conducted in every region surrounded by dicing lines. The semiconductor wafer is diced along the dicing lines to provide a plurality of semiconductor chips. Only a semiconductor chip regarded as non-defective in the wafer test is passed on to the following assembling step. In the form of a final product through the assembling step, a second test called final test is then conducted.

As another conventional art, Japanese Patent Laying-Open No. 6-5668 discloses a method of manufacturing semiconductor chips by selecting only a non-defective semiconductor chip from a wafer. Japanese Patent Laying-Open No. 7-74131 also discloses dicing equipment that can easily provide semiconductor chips from a wafer of reduced thickness, and a method of processing semiconductor chips.

If the implementation of the wafer test described above can completely ensure that a final product has quality, only a simplified test may be conducted after the assembling step to ship the product.

In a conventional wafer test, however, an electrical characteristic of a semiconductor device is tested in the form of a semiconductor wafer which has not yet been divided into semiconductor chips. Therefore, semiconductor devices, which will be divided into individual semiconductor chips for a final product, are still physically connected in the step of the wafer test. This prevents the elimination of an electrical effect produced between the semiconductor chips in conducting the test. Consequently, an electrical characteristic to be implemented in a final product is disadvantageously not tested in the step of the wafer test. This problem has become more serious due to smaller patterns and higher performance of an IC (integrated circuit) in recent years.

In order to make an electrical characteristic of a semiconductor device undergoing a wafer test much closer to that of a final product, a method of conducting a test after obtaining semiconductor chips from a semiconductor wafer may also be considered. In this case, the test can be conducted on the semiconductor device that has been divided into individual semiconductor chips. However, the implementation of the wafer test on individual semiconductor chips requires pieces of apparatus to position each of the semiconductor chips on a test holder, and to remove the semiconductor chips from the holder after the test. Since high accuracy in positioning is required for such apparatus and an enormous number of apparatus will be required, a large amount of capital investment on equipment is needed. For these reasons, as in the description of the conventional art, a wafer test in the form of a semiconductor wafer, and a final test for a final product are currently conducted.

A final test is indispensable to find a defect caused in an assembling step. However, there is a case where a defective product which is not attributed to a substep carried out in an assembling step but simply to the failure of detecting it in a wafer test, is found in the step of a final test. In this case, all the operations performed on the defective product in the steps following the assembling step become useless. This results in a grave managerial problem of increased cost of manufacturing a semiconductor device.

Additionally, in recent years, an MCP (multi chip package) has increasingly been produced, where a plurality of semiconductor chips are incorporated in a single package for assembly. If one of the plurality of semiconductor chips incorporated in an MCP is found defective in the step of a final test, the other semiconductor chips incorporated in the MCP will be wasted. In this way, value added to a product in an assembling step tends to increase, and a damage due to the failure of detecting a defective product during a wafer test becomes large.

In the MCP described above, a plurality of semiconductor chips must be stacked in a direction of a thickness to be incorporated in a single package. This requires less thick semiconductor chips than conventional by performing a polishing step prior to an assembling step. If a back surface of a semiconductor wafer is polished prior to a wafer test, however, rigidity of the semiconductor wafer decreases. This results in a problem regarding the fact that a semiconductor wafer cannot withstand the stylus force from a probe of test equipment in undergoing a wafer test.

Thus, under the current circumstances, a wafer test is conducted first, and then a polishing step is performed. In this case, the wafer test is conducted on a wafer of thickness different from that of a final product. This is similarly disadvantageous as an electrical characteristic to be implemented in the final product is not tested.

SUMMARY OF THE INVENTION

Therefore, an object of the present invention is to solve the problems mentioned above, and to provide a method of testing a semiconductor device which can test an electrical characteristic with higher accuracy prior to an assembling step.

A method of testing a semiconductor device in accordance with the present invention includes the steps of: positioning on a surface of a sheet-like member a semiconductor wafer provided with the semiconductor device; dividing the semiconductor wafer into a plurality of semiconductor chips on the surface by dicing the semiconductor wafer; and, with the plurality of semiconductor chips positioned on the surface, testing an electrical characteristic of a semiconductor device formed at each of the plurality of semiconductor chips.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

(First Embodiment)

A method of testing a semiconductor device prior to an assembling step (a step of mounting semiconductor chips obtained from a semiconductor wafer on a package) will be described in the following.

Figure 1:
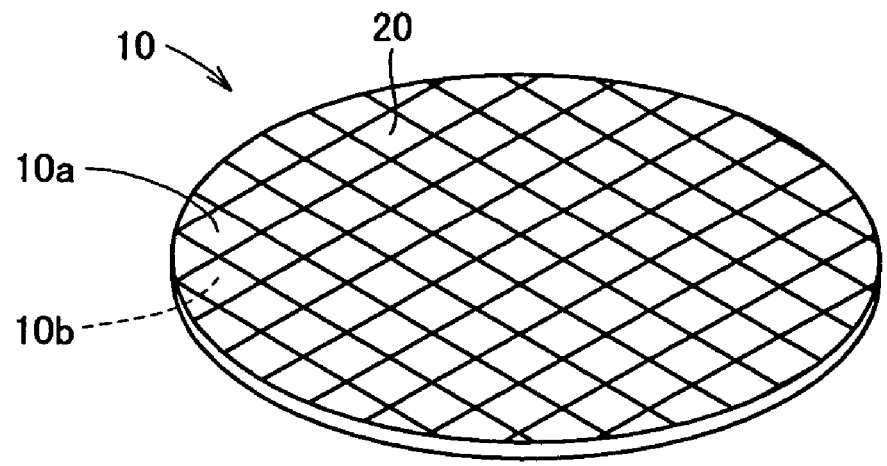
FIG. 1 is a perspective view showing a first step of a method of testing a semiconductor device in a first embodiment of the present invention.

Referring to FIG. 1, a semiconductor device 20 is formed on a semiconductor wafer 10 made of silicon, for example, by performing a prescribed manufacturing step.

Figure 2:
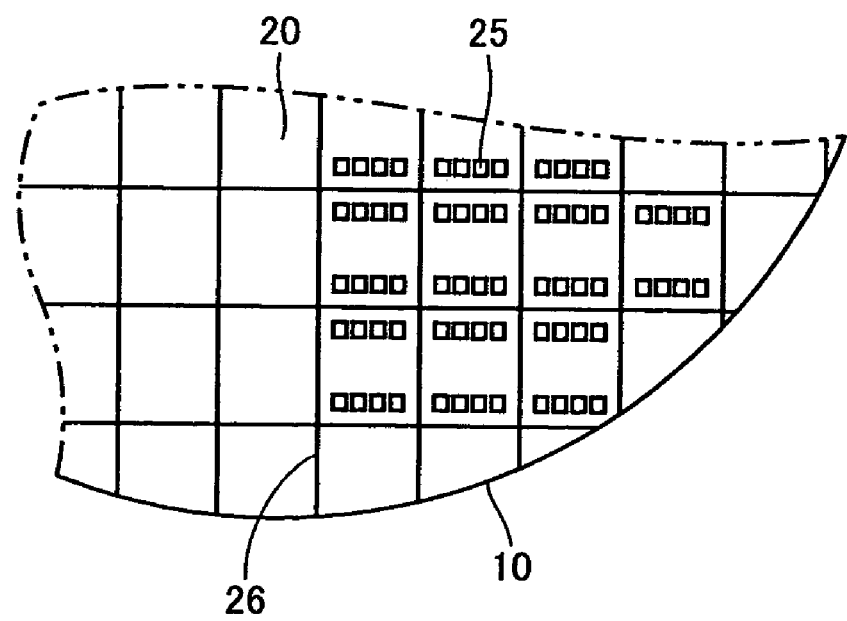
FIG. 2 is a plan view showing the first step of the method of testing a semiconductor device in the first embodiment of the present invention.

FIG. 2 is a plan view showing an enlarged portion of a surface 10a of semiconductor wafer 10 shown in FIG. 1. Referring to FIG. 2, a dicing line 26 is formed on surface 10a of semiconductor wafer 10 provided with semiconductor device 20. Along the line, wafer 10 is diced by a dicing saw in a following dicing step. Through the dicing step, a plurality of semiconductor chips are obtained from semiconductor wafer 10. In a region surrounded by dicing lines 26, semiconductor device 20 is formed to configure each of the plurality of semiconductor chips. A plurality of electrodes 25 are formed at surface 10a of semiconductor wafer 10.

Semiconductor wafer 10 is then set at polishing equipment to have a back surface 10b polished. Back surface 10b is a surface opposite to surface 10a where semiconductor device 20 is formed. When semiconductor wafer 10 is an 8-inch wafer of 725 $\mu$m in thickness, for example, the polishing reduces the thickness of semiconductor wafer 10 to be as thin as 100 $\mu$m to 150 $\mu$m. This enables the thickness of the semiconductor chips obtained from semiconductor wafer 10 to be reduced.

Figure 3:
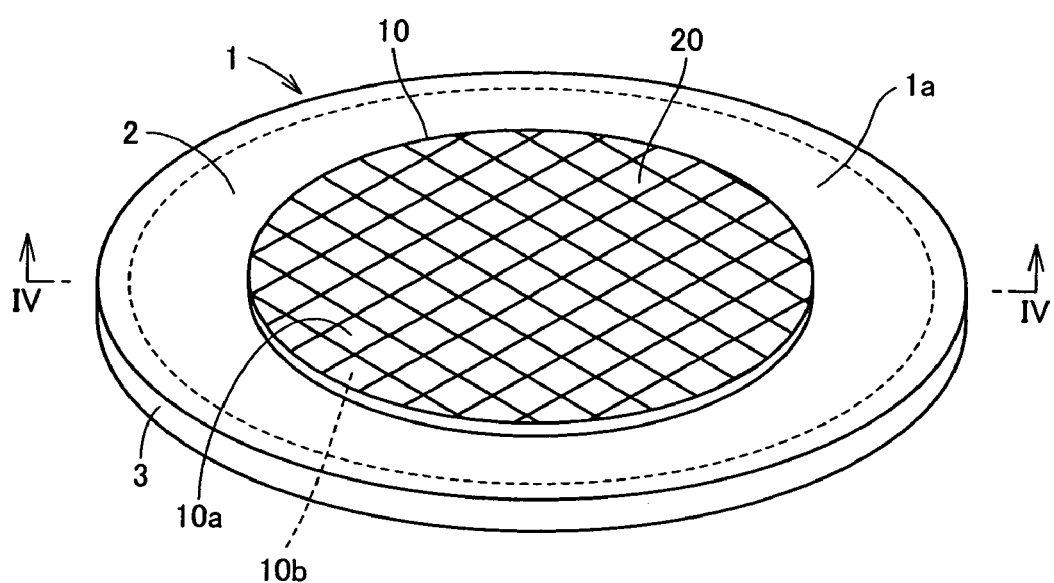
FIG. 3 is a perspective view showing a second step of the method of testing a semiconductor device in the first embodiment of the present invention.

Referring to FIG. 3, semiconductor wafer 10 is bonded onto a surface 1a of a test jig 1. Semiconductor wafer 10 is positioned such that back surface 10b of semiconductor wafer 10 is opposite to surface 1a of test jig 1.

Figure 4:
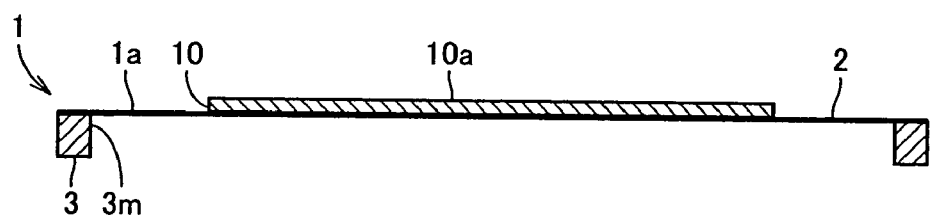
FIG. 4 is a cross sectional view showing the second step of the method of testing a semiconductor device in the first embodiment of the present invention.

FIG. 4 is a cross sectional view along a line IV—IV in FIG. 3. Referring to FIGS. 3 and 4, test jig 1 is formed of a sheet-like dicing sheet 2 and an annular holder 3. Holder 3 extends along a peripheral edge of dicing sheet 2. An internal periphery 3m of holder 3 is shaped such that test jig 1 can be set in a detachably attachable manner at test equipment in a following step. Dicing sheet 2 is bonded to holder 3 using an adhesive.

Dicing sheet 2 is made of vinyl chloride or similar soft synthetic resin. Dicing sheet 2 is approximately 100 $\mu$m thick. Holder 3 is made of stainless steel (SUS; as referred to by JIS). Holder 3 may be made of other metals or synthetic resin with a level of rigidity.

While the present embodiment utilizes dicing sheet 2 and holder 3 as members configuring test jig 1, it is not limited thereto. A holder may be utilized with a plate-like rigid member, for example, in place of a dicing sheet. Such a plate-like member may be integrated with a holder to form a test jig.

Figure 5:
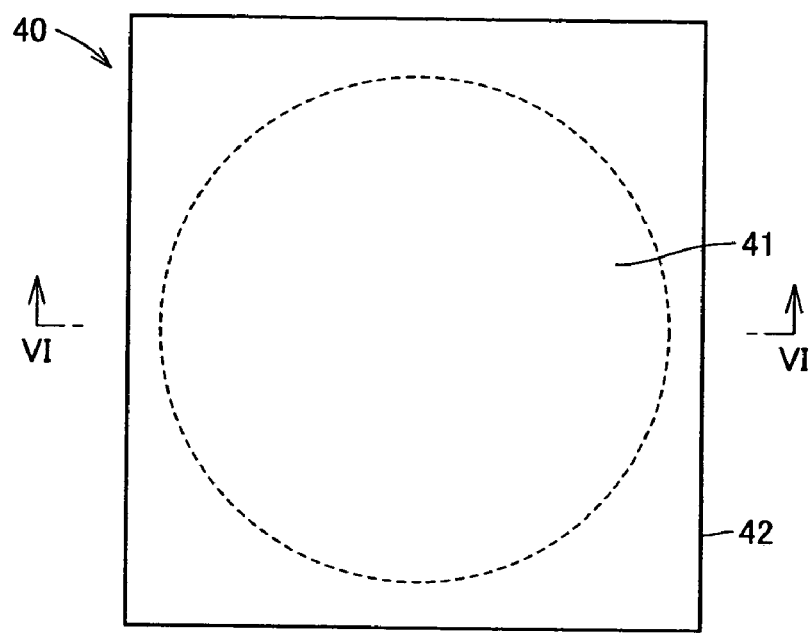
FIG. 5 is a plan view showing a modification of the holder shown in FIGS. 3 and 4.
Figure 6:
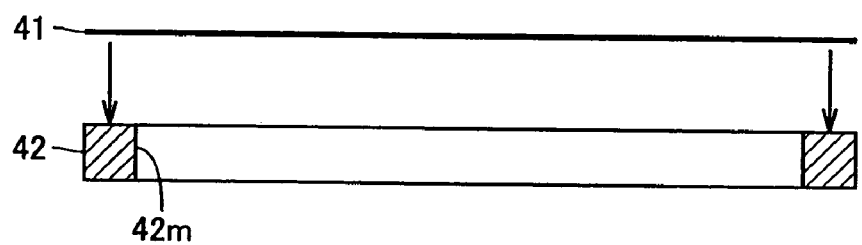
FIG. 6 is a cross sectional view for illustrating a structure of the holder in FIG. 5.

FIG. 6 depicts a configuration corresponding to the cross-section along a line VI—VI in FIG. 5.

Referring to FIGS. 5 and 6, a test jig 40 includes a sheet-like dicing sheet 41 and a holder 42. Holder 42 has a square shape. At the center of holder 42, a circular opening defined by an internal periphery 42m of holder 42 is formed. Internal periphery 42m of holder 42 is shaped such that test jig 40 can be set in a detachably attachable manner at test equipment in a following step. Dicing sheet 41 is bonded to holder 42 using an adhesive.

Figure 7:
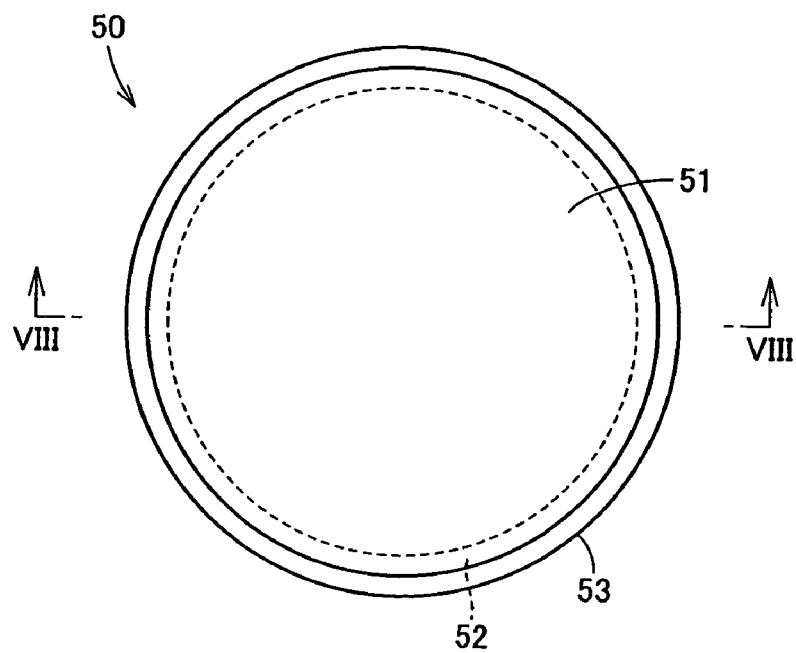
FIG. 7 is a plan view showing another modification of the holder shown in FIGS. 3 and 4.
Figure 8:
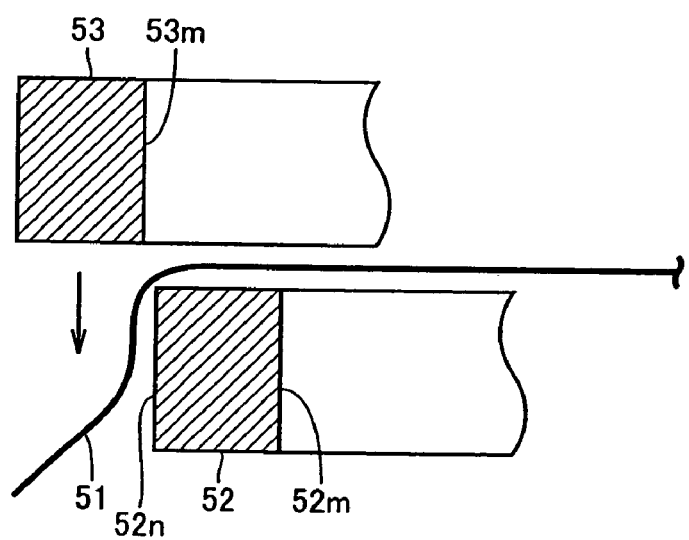
FIG. 8 is a cross sectional view for illustrating a structure of the holder in FIG. 7.

FIG. 8 depicts a configuration corresponding to the cross-section along a line VIII—VIII in FIG. 7.

Referring to FIGS. 7 and 8, a test jig 50 includes a sheet-like dicing sheet 51, an annular holder 53, and an annular holder 52 formed one size smaller than holder 53. An internal periphery 52m of holder 52 is shaped such that test jig 50 can be set in a detachably attachable manner at test equipment in a following step. An internal periphery 53m of holder 53 is fit into an external periphery 52n of holder 52 for integrating holders 53 and 52. Dicing sheet 51 is sandwiched between external periphery 52n and internal periphery 53m to be fixed at one end surface of holder 52.

Figure 9:
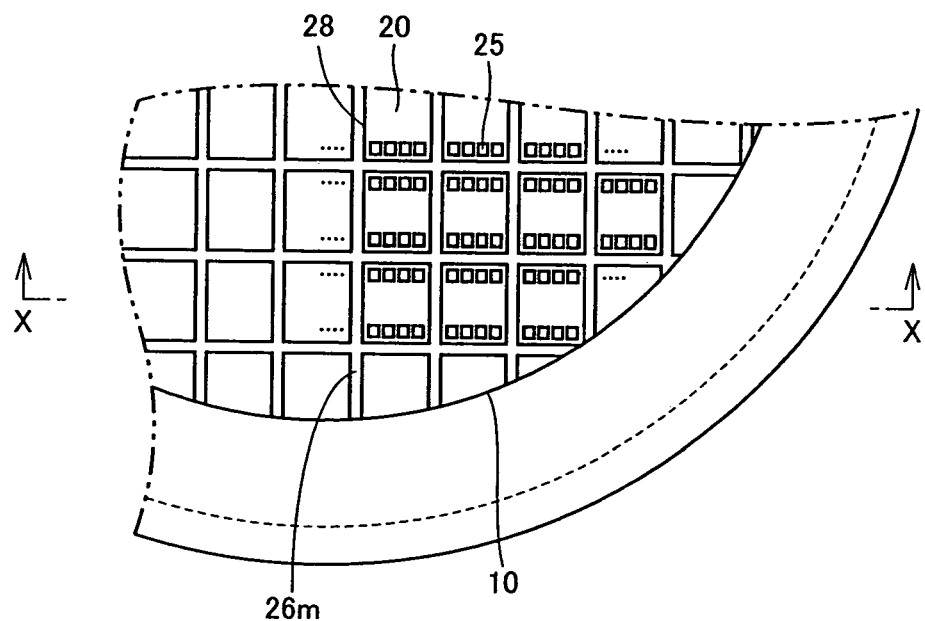
FIG. 9 is a plan view showing a third step of the method of testing a semiconductor device in the first embodiment of the present invention.

Referring to FIG. 9, an enlarged portion of semiconductor wafer 10 positioned at test jig 1 is shown. Test jig 1 where semiconductor wafer 10 is positioned is set at dicing equipment. A dicing saw of the dicing equipment rotates to cut semiconductor wafer 10 along dicing line 26.

Figure 10:
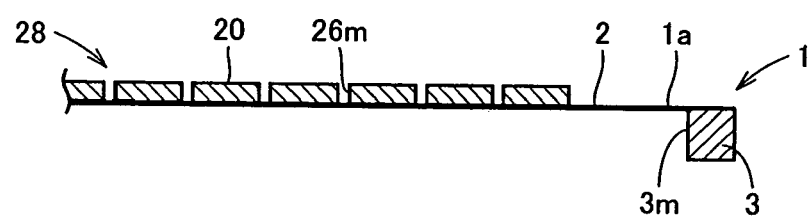
FIG. 10 is a cross sectional view showing the third step of the method of testing a semiconductor device in the first embodiment of the present invention.

FIG. 10 is a cross sectional view along a line X—X in FIG. 9. Referring to FIGS. 9 and 10, semiconductor wafer 10 is diced to form a plurality of semiconductor chips 28 on surface 1a of test jig 1. Each of the plurality of semiconductor chips 28 is physically isolated by dicing lines 26m after dicing. In addition, each of the plurality of semiconductor chips 28 is electrically isolated because dicing sheet 2 is made of an insulating material.

Figure 11:
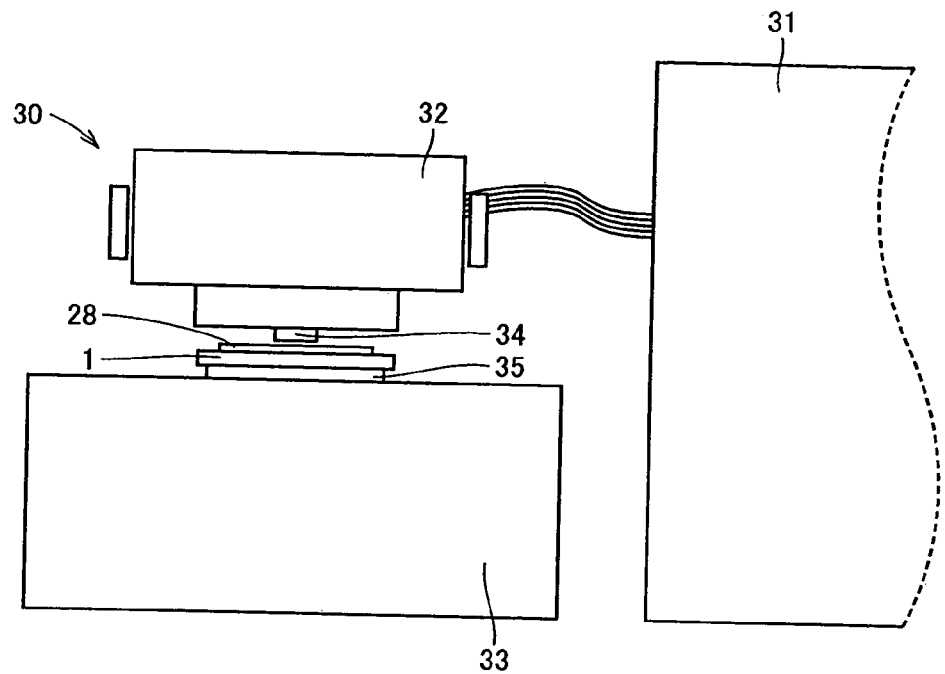
FIG. 11 is a side view showing a fourth step of the method of testing a semiconductor device in the first embodiment of the present invention.

Referring to FIG. 11, a prober 30, or equipment for testing an electrical characteristic of a semiconductor device, is shown. Prober 30 includes a tester body 31, a test head 32 electrically connected with tester body 31, a prober body 33 provided lower than test head 32, and a test stage 35 provided on the side of an upper surface of prober body 33. Semiconductor chips 28 positioned at test jig 1 are set at test stage 35. Prober 30 further includes a probe 34 provided to test head 32 to be opposite to semiconductor chips 28.

Figure 12:
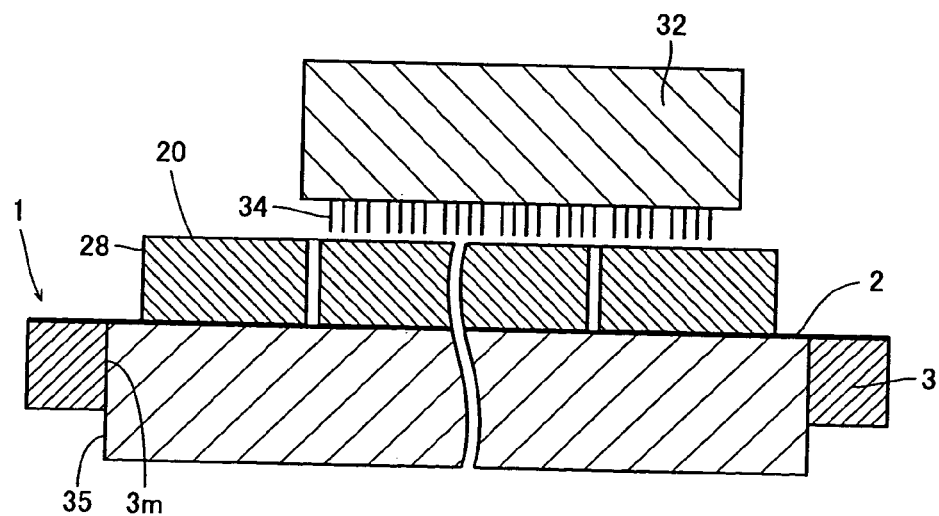
FIG. 12 is a cross sectional view showing the fourth step of the method of testing a semiconductor device in the first embodiment of the present invention.

FIG. 12 is a cross sectional view showing, to an enlarged scale, probe 34 in FIG. 11, and test stage 35 where semiconductor chips 28 are set. Referring to FIG. 12, probe 34 is provided in the form of a needle to contact electrode 25 formed at semiconductor chips 28 (see FIG. 9) to provide electrical conduction between tester body 31 and semiconductor chips 28.

Internal periphery 3m of holder 3 is fit into the external periphery of test stage 35 so that test jig 1 is carried at test stage 35. Diameter of internal periphery 3m of holder 3 is adjusted to ensure such carriage.

Conventionally, in testing a semiconductor wafer with a prober, a suction hole is made in a test stage to suck the semiconductor wafer directly. However, there may be a case where, depending on a place in which the suction hole is made, an electrode positioned immediately above the suction hole is contacted by a probe. In this case, the semiconductor wafer, having a reduced thickness, can fail to withstand the stylus force from the probe. In the present embodiment, in contrast, test jig 1 can be held without suction, which can solve such a problem.

Referring to FIGS. 11 and 12, an electrical characteristic of semiconductor device 20 formed at semiconductor chips 28 is tested using prober 30. This test determines whether semiconductor device 20, formed at each of the plurality of semiconductor chips 28, implements an intended operation and performance. Through this, whether semiconductor chips 28 are defective or not is determined.

In order to pass a test result to a following assembling step, a test result of each of the plurality of semiconductor chips 28 is sent to assembling equipment together with its coordinate position on test jig 1, for example, as electronic information. Defective semiconductor chip 28 may also be marked in visually recognizable manner indicating its defectiveness.

Test jig 1 where semiconductor chips 28 are positioned is then moved to an assembling step. In the assembling step, only the semiconductor chip 28 recognized as a conforming product is selected for assembly.

A method of testing semiconductor device 20 in accordance with a first embodiment of the present invention includes the steps of: positioning on surface 1a of test jig 1 as a sheet-like member semiconductor wafer 10 provided with semiconductor device 20; dividing semiconductor wafer 10 into a plurality of semiconductor chips 28 on surface 1a by dicing semiconductor wafer 10; and, with the plurality of semiconductor chips 28 positioned on surface 1a, testing an electrical characteristic of semiconductor device 20 formed at each of the plurality of semiconductor chips 28.

The step of testing an electrical characteristic of semiconductor device 20 includes the step of setting test jig 1 at prober 30 serving as equipment for testing the electrical characteristic of semiconductor device 20. Test jig 1 is detachably attached to prober 30.

The method of testing semiconductor device 20 further includes the step of polishing back surface 10b of semiconductor wafer 10 prior to the step of positioning semiconductor wafer 10. The step of positioning semiconductor wafer 10 includes the step of positioning semiconductor wafer 10 on surface 1a of test jig 1 such that surface 1a of test jig 1 and back surface 10b of semiconductor wafer 10 are opposite to each other.

In accordance with the method of testing semiconductor device 20 with such configuration, semiconductor device 20 has already been formed in a closer form to that of a final product when it is tested with prober 30. In other words, semiconductor device 20 to be tested with prober 30 is formed at semiconductor chip 28 obtained by dicing semiconductor wafer 10. In addition, a back surface of semiconductor chip 28 has already been polished while in the form of semiconductor wafer 10. As a result, a thickness of semiconductor chip 28 is reduced to a regular thickness of a final product. This enables an electrical characteristic of semiconductor device 20 to be tested in a closer form to that to be implemented by the final product. Through this, reliability of the test can be improved significantly, and a defective semiconductor chip can be screened more accurately from semiconductor chips 28. When a plurality of semiconductor chips 28 are packaged into an MCP, defective semiconductor chips 28 are not incorporated, so that the manufacturing cost can be minimized.

When semiconductor device 20 is tested, semiconductor chip 28 is positioned at surface 1a of test jig 1. This can increase rigidity of semiconductor chip 28 in testing. Therefore, though semiconductor chip 28 of reduced thickness has lower rigidity, semiconductor chip 28 can withstand the stylus force from probe 34. Additionally, in the step of being positioned at test jig 1, semiconductor device 20 is in the form of semiconductor wafer 10 which has not yet been divided. This enables semiconductor device 20 to be tested easily without a burdensome procedure to position multiple semiconductor chips 28 at test jig 1.

(Second Embodiment)

A method of testing a semiconductor device in a second embodiment of the present invention differs from a method of testing a semiconductor device in the first embodiment in timing when a dicing step is performed. In the following, steps overlapping with those of the first embodiment will not be described.

In steps shown in FIGS. 3 and 4, after semiconductor wafer 10 is positioned at surface 1a of test jig 1, an electrical characteristic of semiconductor device 20 formed at semiconductor wafer 10 is tested in accordance with steps shown in FIGS. 11 and 12. Semiconductor wafer 10 is then diced at a prescribed position to provide a plurality of semiconductor chips 28 from semiconductor wafer 10 in accordance with steps shown in FIGS. 9 and 10.

A method of testing semiconductor device 20 in accordance with a second embodiment of the present invention includes the steps of: polishing back surface 10b of semiconductor wafer 10 provided with semiconductor device 20; positioning semiconductor wafer 10 on surface 1a of test jig 1 as a sheet-like member such that surface 1a and back surface 10b of semiconductor wafer 10 are opposite to each other; and, with semiconductor wafer 10 positioned on surface 1a, testing an electrical characteristic of semiconductor device 20 formed at semiconductor wafer 10.

In accordance with the method of testing semiconductor device 20 with such configuration, when semiconductor device 20 is tested with prober 30, a thickness of semiconductor wafer 10 set at prober 30 has been reduced to a regular thickness of a final product. This enables an electrical characteristic of semiconductor device 20 to be tested in a closer form to that to be implemented by the final product. This enables semiconductor chip 28 which was taken from a position of semiconductor wafer 10 where semiconductor device 20 was found defective, to be eliminated more accurately.

As in an effect described in the first embodiment, semiconductor wafer 10 is positioned at test jig 1 in testing, which enables semiconductor device 20 to be tested, withstanding the stylus force from probe 34. Additionally, semiconductor device 20 can be tested easily without a burdensome procedure to position multiple semiconductor chips 28 at test jig 1.

(Third Embodiment)

In a method of testing a semiconductor device in a third embodiment of the present invention, a step of polishing semiconductor wafer 10 after forming a semiconductor device 20 at semiconductor wafer 10 in steps shown in FIGS. 1 and 2 is eliminated. In steps shown in FIGS. 3 and 4, semiconductor wafer 10 is then bonded to surface 1*a* of test jig 1. In steps shown in FIGS. 11 and 12, test jig 1 is then set at test stage 35 of prober 30. An electrical characteristic of semiconductor device 20 formed at semiconductor wafer 10 is then tested.

A method of testing semiconductor device 20 in accordance with a third embodiment of the present invention includes the steps of: bonding semiconductor wafer 10 provided with semiconductor device 20 onto surface 1*a* of test jig 1 as a sheet-like member such that surface 1*a* and a back surface of semiconductor wafer 10 are opposite to each other; and setting test jig 1 at prober 30 serving as equipment for testing an electrical characteristic of semiconductor device 20, and testing the electrical characteristic of semiconductor device 20 formed at semiconductor wafer 10.

In accordance with the method of testing semiconductor device 20 with such configuration, with semiconductor wafer 10 bonded to test jig 1, test jig 1 is set at prober 30 to test an electrical characteristic of semiconductor device 20. This eliminates the need for vacuum piping provided for sucking a semiconductor wafer utilizing vacuum in a conventional prober. A test stage of a prober is a place where a pitch feed operation of X-Y (planar shift) and –θ (rotational shift) is frequently repeated with a semiconductor wafer mounted thereon. Thus, vacuum piping provided at the test stage was prone to troubles. However, the method of testing semiconductor device 20 in the present embodiment can solve such a problem.

In the first, second, and third embodiments, a test of an electrical characteristic of semiconductor device 20 may be an environmental test such as a burn-in test. A burn-in test is an accelerated test where a circuit is operated for a few hours under a severer condition than that in actual use in terms of temperature, pressure, etc. The burn-in test was conventionally conducted on the form of a final product through an assembling step. However, in recent years, it has been conducted in a step prior to an assembling step.

As described above, in accordance with the present invention, a method of testing a semiconductor device which can test an electrical characteristic with higher accuracy prior to an assembling step, can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
   thinning a semiconductor wafer provided with a semiconductor device to be thinner than 150 $\mu$m by polishing a back surface of the semiconductor wafer;
   bonding said semiconductor wafer on a surface of a sheet-like member such that the back surface of said semiconductor wafer is bonded onto said surface of the sheet-like member;
   dividing said semiconductor wafer into a plurality of semiconductor chips on said surface of the sheet-like member by dicing said semiconductor wafer; and
   after the dividing step, testing an electrical characteristic of said semiconductor device formed at each of said plurality of semiconductor chips with said plurality of semiconductor chips bonded on said surface of the sheet-like member.

2. The method of manufacturing a semiconductor device of claim 1, wherein the testing step comprises setting said semiconductor chips on a test stage in the absence of application of suction to said sheet-like member.

3. The method of manufacturing a semiconductor device of claim 2, wherein, said sheet-like member is fixed on a holder, and the testing step further comprises fitting an internal periphery of said holder into an external periphery of said test stage.

* * * * *